United States Patent [19]
Phillips

[11] 3,818,378
[45] June 18, 1974

[54] PHASE DERIVATIVE MODULATION METHOD AND APPARATUS

[75] Inventor: Chester C. Phillips, Rockville, Md.

[73] Assignee: The United States of America as represented by the Secretary of the Navy, Washington, D.C.

[22] Filed: Feb. 10, 1972

[21] Appl. No.: 225,357

[52] U.S. Cl. .......................... 332/23 A, 325/40
[51] Int. Cl. .......................... H03c 3/40
[58] Field of Search ..... 332/11, 21, 22, 23 A, 23 R; 325/40, 47

[56] References Cited

UNITED STATES PATENTS

| | | | |
|---|---|---|---|
| 2,635,226 | 4/1953 | Harris | 332/23 |
| 3,517,338 | 6/1970 | Herman et al. | 332/23 |
| 3,699,479 | 10/1972 | Thompson et al. | 332/22 |

*Primary Examiner*—Malcolm F. Hubler
*Assistant Examiner*—H. A. Birmiel
*Attorney, Agent, or Firm*—R. S. Sciascia; J. A. Cooke

[57] ABSTRACT

A carrier frequency input is simultaneously applied to a pair of quadrature modulating paths or channels, each containing a pair of cascaded modulator or mixer circuits. In these two modulating paths, the quadrature components of the carrier input are multiplied or mixed with phase quadrature components of a modulating signal whose period is equal to twice the bit length of the input phase code data. The resultant or modulated signals are then additionally mixed with the input phase code data; the phase code input to one modulator path being shifted relative to the phase code input to the other path by one-half of the code bit length. The outputs from the two modulating paths are then recombined to produce an output signal containing no discontinuities in the time waveform.

7 Claims, 3 Drawing Figures

PHASE DERIVATIVE MODULATION METHOD AND APPARATUS

BACKGROUND OF THE INVENTION

Conventional zero to 180° phase modulators have abrupt discontinuities in the time waveform and therefore the rise or transition time from one phase state to another is completely determined by the filtering which follows the phase modulation process. For example, when a 10 megahertz phase coded binary waveform is passed through a 40 megahertz bandwidth filter, the resulting transition regions would necessarily be in the order of 25 nanoseconds because of the bandwidth limitations imposed by the filtering. Consequently, when the time function is viewed on an oscilloscope or the like, it is noted that notches occur in the time waveform during which the amplitude of the waveform is considerably less than the steady state amplitude. As is well-known, this gives rise to some very grave problems when attempting to pass such waveforms through high power limiting transmitters. For example, the output of a so-called forward wave re-intrant beam crossed-field amplifier is characteristically limited after its initial excitation with R.F. and will remain constant irrespective of its input provided that D.C. voltage is applied to the amplifier tube. From a practical standpoint, this means that low amplitude inputs will correspond to noisy outputs and this is one of the very basic reasons why it is desirable to utilize a waveform having no time discontinuities.

As will be appreciated by those skilled in the art, spectral conservation is a generally desired feature in both radar and communications. Conventional binary 180° modulation gives a well-known sin $x/x$ spectrum. The elimination of the time discontinuities generally indicates a more efficient utilization of the available spectrum and less interference to other systems.

DESCRIPTION OF THE INVENTION

In accordance with the present invention, the proposed phase derivative modulation method and apparatus is capable of modulating an input carrier frequency with binary phase code data and producing an output which contains no discontinuities in the time waveform. As will be explained in more detail hereinafter, discontinuities are removed from the time function or waveform by causing the phase code switching transients to occur when the amplitude of the signal being modulated thereby is zero.

This absence of discontinuities enables the output waveform to be completely filterable and makes the proposed modulation technique particularly applicable to pulse compression radars. Moreover, the filterability of the time waveform is also of significance in communications or other systems where close spectral control is desirable. The proposed technique is also ideally suited to a digital pulse compression receiver since a simple mixing to D.C. with the signal output from a coherent local oscillator will recover the original phase coded modulation with high efficiency. Additionally, the proposed modulation technique is somewhat more efficient than conventional 180° phase flip modulation since more of the total energy is concentrated into the central region of the output spectrum, thus permitting for example more information to be transmitted through a band-width-limited channel.

Generally speaking, in the preferred embodiment of the proposed phase derivative method and apparatus of the present invention, quadrature components of a carrier input signal of frequency $\omega_c$ are applied simultaneously to a pair of modulation paths or channels where these carrier component signals are initially multiplied or mixed, in suppressed carrier double sideband balanced mixers, with phase quadrature components of a CW (continuous wave) modulating signal whose period is selected to be exactly equal to twice the bit length of the input phase code data. Subsequently, the modulated signal pair (one modulated signal in each modulation path) resulting from this first modulation step are then additionally mixed with the input phase code data; the phase code input to one modulation path being shifted relative to the phase code input to the other path by one-half the code bit length. As a result, the switching transients of the phase code are precisely time coincident with the points of zero amplitude in the signal pair resulting from the first modulation step. Therefore, when the output signals from the two modulation paths are finally recombined, the final output signal is a phase derivative modulation signal whose time waveform contains no discontinuities; i.e., the only discontinuity in the phase of the modulated waveform is in the derivative of the phase function. As mentioned previously, another important factor about the proposed modulator is that its output is readily filterable and that once filtered, the output spectrum or time waveform can be limited without the introduction of any spurious responses outside of the main spectral lobe, thus making the proposed modulation method and apparatus very attractive for use with the so-called cross-field amplifiers which are subject to high spurious content when the input signals drop below certain critical points.

In view of the above, one object of the present invention is to provide an improved modulation method and apparatus for modulating a carrier frequency signal with phase code data.

Another object of the present invention is to provide a phase derivative modulation method and apparatus in accordance with which phase code switching transients occur when the amplitude of the signal to be modulated therewith is zero, thus removing discontinuities from the output time waveform.

Another object of the present invention is to provide an improved modulation method and apparatus for modulating a carrier frequency signal with phase code information wherein the spectral width of the output modulated signal is substantially reduced, with relatively low sidebands.

Other objects, purposes and characteristic features of the present invention will in part be pointed out as the description of the present invention progresses and in part be obvious from the accompanying drawings, wherein.

Figure 1:
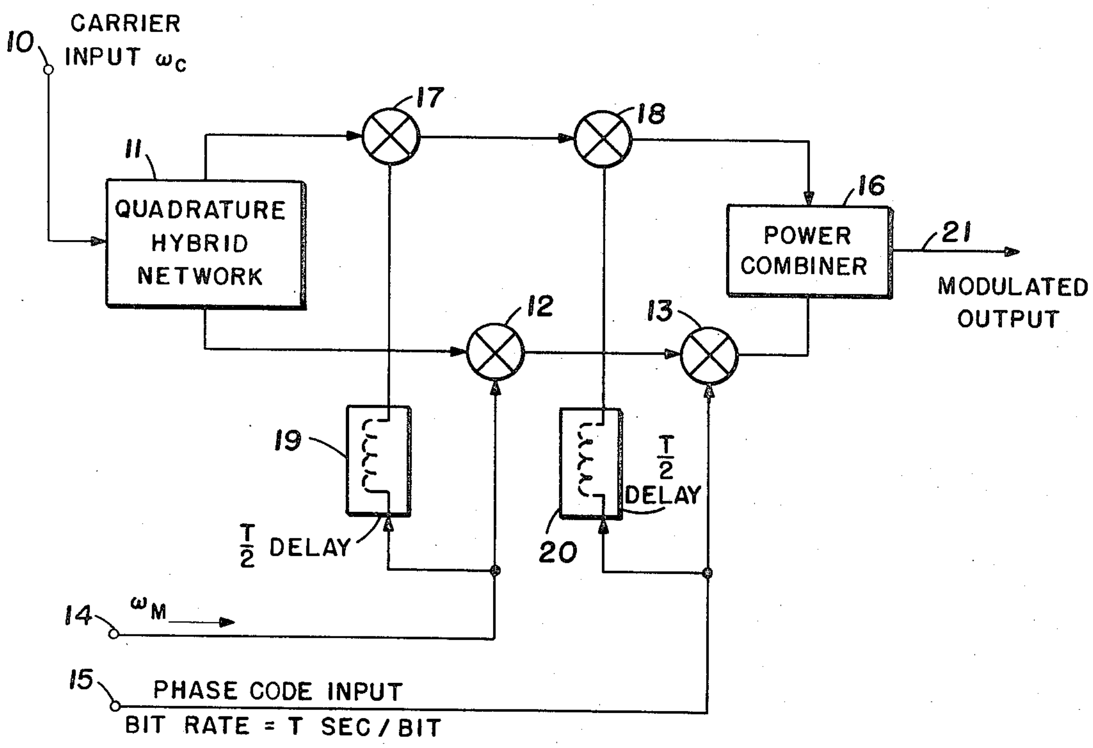
FIG. 1 is a circuit diagram, partly in block diagram form, illustrating one embodiment of the phase derivative modulation method and apparatus of the present invention.

Referring now to FIG. 1 of the drawings, the input carrier signal of frequency $\omega_c$ is applied to input terminal 10 and is initially split into two separate modulation paths or channels through a quadrature hybrid network 11 of any suitable design. This causes two carrier signal components which are in quadrature phase relationship; i.e., 90° apart with respect to one another to appear in the two modulation paths. In the waveform diagram of FIG. 2, the input carrier frequency signal is typically illustrated at line *e*.

In the lower modulation path, the carrier frequency signal component is operated on by two cascaded multiplier or mixer stages 12 and 13, each of which is a suppressed carrier double sideband balanced mixer of any suitable design. More specifically, at the first mixer stage 12 the carrier frequency signal is modulated with a modulation signal of frequency $\omega_m$ which is applied at input terminal 14 and whose period is exactly equal to two segments or bit lengths of the basic phase coding bit rate; i.e., $\omega_m = 2\pi \times (\frac{1}{2}T)$, where T is the basic bit rate of the phase code input data applied at input 15. The modulated output from the mixer 12 is subsequently modulated again in the second mixer stage 13 with the binary phase code input from terminal 15 and is then recombined with the output from the other or upper modulation path of the proposed phase derivative modulator in a suitable power combiner network 16. By way of example, in one test embodiment of the proposed phase derivative modulator the input phase code data consisted of tenth microsecond psuedorandom binary phase codes and the frequency of modulating signal $\omega_m$ was 5 megahertz (5 MHz). Waveforms of a typical modulation signal input for mixer stage 12 and a phase code data input for mixer stage 13 are illustrated at lines *d* and *a* respectively in FIG. 2.

At this point it should be noted that inasmuch as the period of the CW modulation (e.g., at mixer 12) is exactly equal to two segments or bit lengths of the input phase code data, the zero crossings or zero amplitude level points caused by the beating effect of the double sidebands in the first mixing step (see waveform *g* at the output from mixer 12) will exactly correspond to the transition points on the phase coded waveform applied, for example, at mixer 13. Therefore, each abrupt switch in the phase of the carrier signal occurs at a point in time when the carrier amplitude is zero and, as will be explained in more detail hereinafter, causes the time function of the modulator output to contain no discontinuities.

As noted earlier, the upper modulation path shown in FIG. 1, comprising a pair of suppressed carrier double sideband balanced mixers 17 and 18, receives the quadrature carrier signal component from hybrid 11 and modulates this carrier signal in exactly the same fashion as just described for the lower modulation arm including mixers 12 and 13. One essential difference however is that the modulation functions; i.e., modulation signal $\omega_m$ at mixer 17 and the phase coding signal at mixer 18, are in phase quadrature with the corresponding modulation functions in the lower mixer stages 12 and 13. Referring to the typical waveforms of FIG. 2, the modulating signal component of frequency $\omega_m$ applied to mixer 17 is is illustrated at line *c*; whereas, the phase code input to mixer 18 is shown at line *b*. As will be obvious to one skilled in the art, the necessary phase quadrature relationship between the modulating functions applied to the upper and lower modulation paths can be obtained by a variety of techniques, but is symbolically illustrated in FIG. 1 as being obtained by a pair of delay networks 19 and 20 which cause the associated modulating signal (the modulation frequency $\omega_m$ or the phase code input applied at 14 and 15 respectively) to be delayed by time $T/2$ relative to the corresponding modulation functions for the lower modulation path. Consequently, the switching transients generated during the phase code modulation taking place in the upper path at mixer 18 also occur only when the amplitude of the modulated carrier signal output from the preceding mixer stage 17 (see waveform *f* in FIG. 2) is zero; thus removing the disontinuities in the time function.

Figure 2:
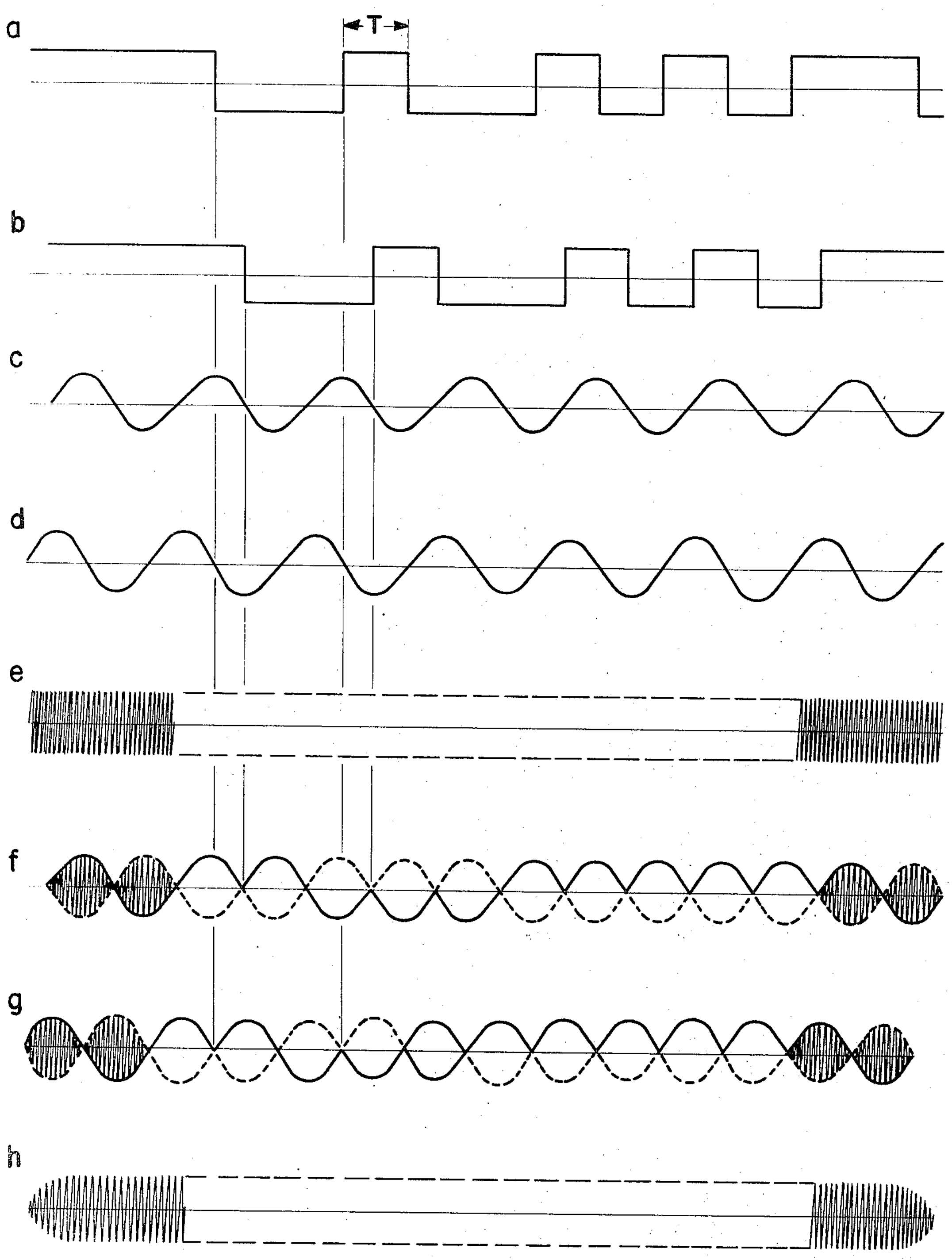
FIG. 2 is a graphical illustration of various waveforms useful in explaining the operation of the embodiment of FIG. 1.

In the illustrated waveforms *f* and *g* of FIG. 2 the phase of the respective modulations produced in the two modulation paths is shown by the solid lines; whereas, the envelopes of modulation are outlined in dotted form and are filled in with the carrier signal $\omega_c$ upon which the modulation takes place. As noted earlier, waveform *f* represents the product of waveforms *b*, *c* and *e*, and waveform *g* is obtained as the product of waveforms *a*, *d* and *e*. When the modulated output waveforms from the upper and lower modulation paths are subsequently combined in a suitable power combiner network 16, the resultant output signal appearing on line 21 (waveform *h* in FIG. 2) will have no amplitude modulations and no abrupt changes in phase; i.e., no time discontinuities. This feature is critically important for certain applications of the proposed modulator, as mentioned earlier. In addition, the demodulation of the output waveform of line *h* in order to recover the original modulating signal of waveform *a*, for example, is very simple and requires only a frequency that is offset from the carrier frequency $\omega_c$ by the modulation frequency $\omega_m$. Depending upon the phase of the addition of waveforms *f* and *g*, the characteristic frequency of waveform *h* will be shifted either up or down with the midband of the modulated waveform approximately half way between the carrier frequency of waveform *e* and the carrier frequency plus or minus the delta or modulation frequency $\omega_m$.

Figure 3:
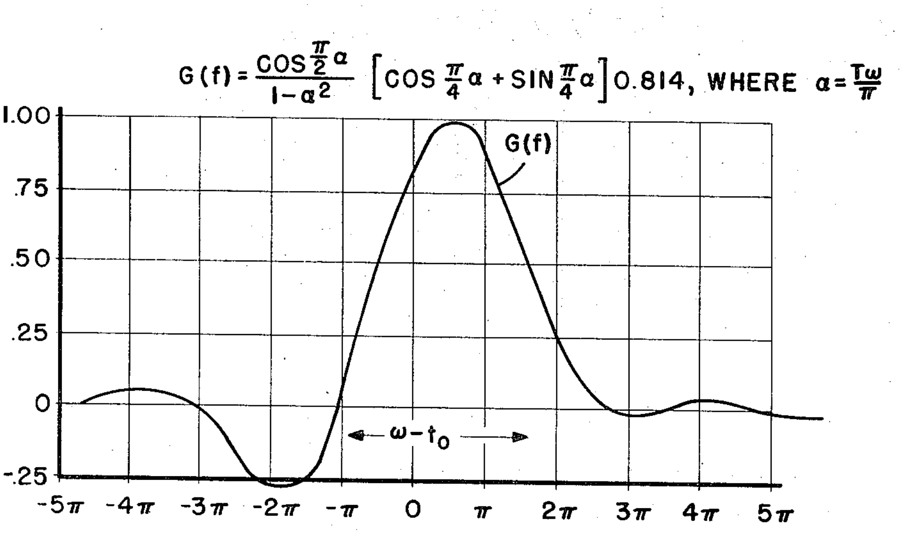
FIG. 3 is a graphical illustration of a typical output spectrum produced by the phase derivative modulation method and apparatus of the present invention.

A typical output spectrum produced by the proposed phase derivative modulation method and apparatus of the present invention is illustrated at waveform $G(f)$ in FIG. 3 of the drawings and is seen to be equal to the spectrum of two cosine pulses 90° apart in both time and phase. As noted hereinabove, the output spectrum from the proposed modulator will be shifted up or down by one-half of the modulating frequency $\omega_m$ depending upon whether the leading time segment lags or leads in the carrier phase term. Moreover, more energy is concentrated into the central region of the spectrum so that the spectrum of FIG. 3 is substantially narrower than the spectrum of a simple binary phase coded waveform. By way of example, a simple binary phase coded waveform with a bit period of 0.1 microseconds will have a 3 db bandwidth of approximately 10 megahertz; whereas, the 3 db bandwidth at the output of the proposed phase derivative modulator of the present invention will be approximately 8 megahertz. In addition to reducing spectral width, the proposed modulation technique also reduces so-called spectral splatter and results in a more rapid fall-off to the noise level.

A potential alternative to the embodiment shown and described hereinabove is to use the double sideband mixers with a phase code that is inverted every other bit segment. For this case the demodulating local oscillator would be operated at the carrier frequency rather than at the sideband frequency $\omega_c \pm \omega_m$. However, the required circuitry would be substantially identical to that described hereinabove. Another possible alternative is to multiply the modulation signal $\omega_m$ and the phase code input together in a separate mixing device and then only one mixer need be placed in each of the two branches of the modulator. Moreover, the same phase derivative waveform may be generated by segments of two frequencies ($\omega_c \pm \omega_m$) which are pieced together in T/2 segments.

Various other modifications, adaptations and alterations of the present invention are of course possible in light of the above teachings. It should therefore be understood at this time that within the scope of the appended claims, the invention may be practiced otherwise than as is specifically described hereinabove.

What is claimed is:

1. A method for modulating a carrier signal of frequency $\omega_c$ with an input code data signal having a preselected code bit length $T$, said method comprising the steps of:

generating quadrature components of said carrier signal, generating from said input code data signal a first pair of modulating signals which are displaced relative to one another by a time interval of $T/2$, generating from a signal whose frequency $\omega_m$ is selected such that it equals $2\pi\,(\frac{1}{2}T)$ a second pair of modulation signal components which are in phase quadrature relative to one another, modulating in a pair of modulation paths each of said carrier signal components with a different component of said second modulation signal pair to produce first and second modulated signals, subsequently modulating each of said first and second modulated signals with a different one of said first pair of modulating signals to produce third and fourth modulated signals, and combining said third and fourth modulated signals.

2. The method specified in claim 1 wherein the step of generating said quadrature components of said carrier signal is accomplished by applying said carrier signal as input to a quadrature hybrid network effective to produce a pair of output signals of frequency $\omega_c$ but 90° apart in phase and then applying one output signal from said quadrature hybrid network to one of said modulation paths and the other output signal from said hybrid network to the other of said modulation paths.

3. The method specified in claim 1 wherein said second modulation signal pair is generated by applying said signal of frequency $\omega_m$ to one modulation path directly and to the other modulation path through a delay network which produces an output delayed from its input by a time equal to $T/2$.

4. The method specified in claim 1 wherein said first modulation signal pair is generated by applying said code data input signal to one modulation path directly and to the other modulation path through a delay network which produces an output delayed from its input by a time equal to $T/2$.

5. The method specified in claim 3 wherein said first modulation signal pair is generated by applying said code data input signal to one modulation path directly and to the other modulation path through a delay network which produces an output delayed from its input by a time equal to $T/2$.

6. The method specified in claim 1 wherein the step of generating said quadrature components of said carrier signal is accomplished by applying said carrier signal as input to a quadrature hybrid network effective to produce a pair of output signals of frequency $\omega_c$ but 90° apart in phase and then applying one output signal from said quadrature hybrid network to one of said modulation paths and the other output signal from said hybrid network to the other of said modulation paths, wherein said second modulation signal pair is generated by applying said signal of frequency $\omega_m$ to one modulation path directly and to the other modulation path through a delay network which produces an output delayed from its input by a time equal to $T/2$, and wherein said first modulation signal pair is generated by applying said code data input signal to one modulation path directly and to the other modulation path through a delay network which produces an output delayed from its input by a time equal to $T/2$.

7. The modulation method specified in claim 1 wherein the successive steps of initially modulating each carrier signal component with a different component of said second modulation signal pair and subsequently modulating the resultant first and second modulated signals with a different one of said first pair of modulating signals are each accomplished in a suppressed carrier double side-band balanced mixer.

* * * * *